United States Patent
Kobayashi

(10) Patent No.: US 6,495,879 B1
(45) Date of Patent: Dec. 17, 2002

(54) FERROELECTRIC MEMORY DEVICE HAVING A PROTECTIVE LAYER

(75) Inventor: Sota Kobayashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/447,069

(22) Filed: Nov. 22, 1999

(30) Foreign Application Priority Data

Nov. 30, 1998 (JP) .............................................. 10-339073

(51) Int. Cl.[7] ........................ H01L 27/108; H01L 29/76; H01L 29/94; H01L 31/119
(52) U.S. Cl. ........................ 257/310; 257/295; 257/300; 257/306
(58) Field of Search ........................... 257/71, 68, 295, 257/296, 303, 306, 307, 308, 309, 310, 311, 312, 313, 532, 632, 639, 640, 646; 438/3, 238, 240, 250, 373

(56) References Cited

U.S. PATENT DOCUMENTS

| | | |
|---|---|---|
| 5,510,651 A | 4/1996 | Maniar et al. |
| 5,578,867 A | 11/1996 | Argos, Jr. et al. |
| 5,780,351 A | 7/1998 | Arita et al. |
| 5,811,849 A * | 9/1998 | Matsuura .................... 257/306 |
| 5,841,160 A | 11/1998 | Nakamura |
| 6,197,628 B1 * | 3/2001 | Vaartstra et al. ............ 438/238 |

FOREIGN PATENT DOCUMENTS

| | | |
|---|---|---|
| JP | 4-15957 | 1/1992 |
| JP | 10-95846 | 4/1998 |

* cited by examiner

*Primary Examiner*—Olik Chaudhuri
*Assistant Examiner*—Theresa T. Doan
(74) *Attorney, Agent, or Firm*—Choate, Hall & Stewart

(57) ABSTRACT

A ferroelectric memory device includes an array of memory cells each having a cell transistor and a ferroelectric capacitor, an insulator film overlying the ferroelectric capacitor and including $SiN_x$ or $SiO_xN_y$, and a protective layer interposed between the insulator film and the ferroelectric capacitor. The ferroelectric capacitor is protected by a protective layer against degradation of storage and programming characteristics which may be caused by the insulator film. The protective layer includes Ir, $IrO_2$, Ru, $RuO_2$ or $Al_2O_3$. The ferroelectric capacitor is also protected against water by the insulator film overlying the first protective layer.

5 Claims, 12 Drawing Sheets

FERROELECTRIC MEMORY DEVICE HAVING A PROTECTIVE LAYER

BACKGROUND OF THE INVENTION (a) Field of the Invention

The present invention relates to a ferroelectric memory device having a protective layer and, more particularly, to a ferroelectric memory device having a ferroelectric capacitor and a memory cell transistor in combination in each memory cell.

(b) Description of a Related Art

A ferroelectric memory device including a ferroelectric capacitor having a ferroelectric film as a capacitor film is extensively developed for use in a variety of electronic applications. The ferroelectric capacitor stores data by using the state of polarization of the ferroelectric film sandwiched between electrodes of the ferroelectric capacitor, wherein the ferroelectric film has a remnant polarization capable of being switched in the direction thereof by an applied voltage.

FIG. 1 shows an example of a memory cell having a ferroelectric capacitor in a conventional ferroelectric memory device, and FIG. 2 shows an equivalent circuit diagram of the memory cell of FIG. 1. The memory cell 30 includes a cell transistor 24 implemented by a FET and a cell capacitor 25 implemented as a ferroelectric capacitor. The FET 24 has a pair of source/drain regions 18 including one connected to a bit line BL extending in a row direction and the other connected to a first electrode of the ferroelectric capacitor 25, and a gate connected to a word line WL extending in a column direction. The ferroelectric capacitor 25 has a second electrode connected to a plate line PL extending in the column direction. A plurality of memory cells are arranged in a matrix to form a memory cell array of a large-scale ferroelectric memory device.

FIG. 3 shows a hysteresis polarization characteristic of the ferroelectric film, with the applied voltage (volts) and the polarization ($\mu$coulomb per centimeter) of the ferroelectric film being plotted on the abscissa and the ordinate, respectively. The applied voltage is plotted in a positive direction if the plate line PL is applied with a positive voltage with respect to the bit line BL. When the word line WL and the bit line BL are applied with 5 volts, for example, and the plate line PL is applied with zero volt, the ferroelectric film stays at point "A" of the polarization curve in FIG. 3, and then shits to point "B" if the bit line BL is subsequently applied with zero volt with the remaining lines being maintained at the previous voltages.

On the other hand, when the word line WL and the plate line PL are applied with 5 volts, with the bit line being applied with zero volt, the ferroelectric film stays at point "C", and then shits to point "D" if the plate line PL is applied subsequently with zero volt. By defining "1" for the state of the ferroelectric film at point "B", and "0" for the state at point "D", the ferroelectric capacitor stores data after applying the described voltages.

It is desirable that the ferroelectric film have a large difference between the remnant polarizations at points "D" and "B" for improving the storage characteristic and programming. characteristic. The term "storage characteristic" means reliability of the ferroelectric capacitor storing the data without an error whereas the term "programming characteristics" means resistance or tolerance of the ferroelectric capacitor against defects due to a large number of times for overwriting of the stored data.

FIGS. 4 and 5 depict cross-sections of the memory cell of FIG. 1 taken along lines IV—IV and V—V, respectively, in FIG. 1. The cell transistor includes source/drain regions 18 implemented by $n^+$-diffused regions in the surface region of the semiconductor substrate 11, and a gate 17 formed on the semiconductor substrate 11 with an intervention of a gate oxide film not shown in the figure. The bit line including Al as a main component thereof is connected to one of the source/drain regions 18 of the cell transistor.

The ferroelectric capacitor 25 is disposed above the cell transistor, and includes a bottom electrode 13, a ferroelectric film 14 and a top electrode 15. The ferroelectric capacitor 25 is protected by a cover film 19 made of $SiO_2$, for example.

An alumina ($Al_2O_3$) film may be interposed between the ferroelectric capacitor 25 and the cover film 19 for prevention of thermal evaporation of elements constituting the ferroelectric material during the fabrication process, as described in "Proceedings of International Symposium on Integrated Ferroelectrics", for example. The top electrode 15 is connected to the other of the source/drain regions 18 through an interconnect layer 16.

In the Configuration of the conventional ferroelectric memory device, the word line WL implements the gate electrodes 17 of the cell transistors, whereas the plate line PL implements the bottom electrodes 13 of the ferroelectric capacitors 25. The ferroelectric film 14 is made from PZT [$(Pb,La)(Zr,Ti)O_3$] or SBT [$SrBi_2(Nb,Ta)_2O_9$]

The ferroelectric film 14 is generally formed in an oxidation ambient, often followed by a thermal annealing treatment in an oxygen ambient for stabilization of the ferroelectric film 14. In view of the thermal annealing, noble metals such as Pt or Ir, or conductive oxides such as $IrO_2$ and $RuO_2$ having an acid resistance are generally used for the material of the top and bottom electrodes. On the other hand, a layered structure including $WSi_2$ film, TiN film and Al film is generally used for the material of the interconnect layer 16 in view of the feasibility of fine patterning, excellent adherence with respect to Si or $SiO_2$ and a low resistivity.

In a thermal treatment during fabrication of the ferroelectric memory device, it is known that Si diffuses into the Al film if the Al film is disposed in direct contact with Si in the diffused region. This may cause destruction of the p-n junction formed between the diffused region 18 and the semiconductor substrate 11. A TiN film is often used as a barrier film for prevention of the mutual diffusion between Al and Si, whereby the layered structure for the interconnect layer 16 includes, as mentioned above, $WSi_2$, TiN and Al as viewed from the bottom. In this configuration, it is considered that TiN has a poor adherence with respect to Si and $SiO_2$ and a high contact resistance with respect to Si, and that $WSi_2$ has a function for suppressing degradation of the polarization characteristic of the ferroelectric material after formation of the interconnect layers, as described in Patent Publication JP-A-10-095846.

An interlayer dielectric film 20 such as silicon oxide film is deposited on the interconnect layer 16, followed by formation of a protective layer (insulator film) 21 such as $SiN_x$ film or $SiO_xN_y$ film for prevention of water, as described in Patent Publication JP-A-4-15957. The $SiN_x$ film or $SiO_xN_y$ film as used herein protects the interconnect layer having Al as a main component thereof against corrosion due to water entering from atmosphere.

FIGS. 6A to 6C show sectional views, taken along line V—V in FIG. 1, of the memory cell in consecutive steps of fabrication thereof. In FIG. 6A, the ferroelectric capacitor 25 including the bottom electrode 13, the ferroelectric film 14 and the top electrode 15 is formed on an interlayer dielectric film 26, followed by formation of the cover film 19 thereon. Subsequently, via holes 27 are formed for exposing the diffused regions 18 of the substrate 11 and the top electrode 15 of the ferroelectric capacitor 25, as shown in FIG. 6B. Thereafter, the interconnect layer 16 for connecting one of the diffused regions 18 and the top electrode 15 as well as the bit line are formed. Further, the interlayer dielectric film 20 and the protective film 22 such as $SiN_x$ film or $SiO_xN_y$ film are consecutively formed on the interconnect layer 16 and the bit line, as shown in FIG. 6C. The protective film 22 is formed by using a plasma-enhanced CVD (PECVD) process at a substrate temperature of about 300° C.

The PECVD process as used for depositing the protective film 22 has a problem in that the process causes reduction of the remnant polarization of the ferroelectric film. It is considered that the reduction results from the tensile stress acting on the ferroelectric film 14 and generated by lowering the temperature of the $SiN_x$ film or $SiO_xN_y$ film (referred to sometimes as simply $SiN_x$ film hereinafter) 22 after the formation thereof.

The fact that the ferroelectric film has a remnant polarization without a continued applied voltage results from the tolerance of the ferroelectric film, which is generated by the crystal strain for resisting the Coulomb force canceling the remnant polarization. Thus, the polarization characteristic of the ferroelectric film is generally affected by the stress acting on the ferroelectric film.

It can be understood that the PECVD process for the SiNx film generates a thermal stress acting as a tensile stress on the ferroelectric film, from the following description.

When the substrate temperature is raised up to 300° C. for the PECVD process, both the interconnect layer and the ferroelectric film thermally expand. Since the interconnect layer made of a metal or alloy has a higher coefficient of thermal expansion compared to the ferroelectric film, the ferroelectric film is applied with a tensile stress by the interconnect layer at this stage. While the substrate temperature is lowered after the deposition of the $SiN_x$ film, the interconnect layer contracts. The contraction of the interconnect layer is prevented by the ferroelectric film having a lower coefficient of thermal expansion.

Therefore, after the substrate temperature is lowered to a room temperature, the thermal stress acting as the tensile stress remains on the ferroelectric film as the residual stress. The reduction of the remnant polarization is considered due to the residual tensile stress on the ferroelectric film. The reduction of the remnant. polarization degrades the storage characteristic and the programming characteristic of the ferroelectric capacitor.

SUMMARY OF THE INVENTION

In view of the above, it is an object of the present invention to provide a ferroelectric memory device having a ferroelectric capacitor in each memory cell, which has an excellent storage characteristic and an excellent programming characteristic.

It is another object of the present invention to provide a method for fabricating the ferroelectric memory device as described above.

The present invention provides a ferroelectric memory device including: an array of memory cells each having a cell transistor and a ferroelectric capacitor formed on a semiconductor substrate: a peripheral circuit: an interconnection structure for connecting the cell transistor, the ferroelectric capacitor and the peripheral circuit to store data in each of the memory cells, the ferroelectric capacitor including a bottom electrode, a ferroelectric film and a top electrode, the interconnection structure including a first interconnect layer in contact with the top electrode: an interlayer dielectric film formed on the first interconnect layer: an insulator film overlying the interlayer dielectric film and including at least one of $SiN_x$ and $SiO_xN_y$: and a protective layer disposed between the interlayer dielectric film and the insulator film and having a higher modulus of elasticity than said interconnect layer.

The protective layer preferably includes at least one of Ir, $IrO_2$, Ru, $RuO_2$ and $Al_2O_3$ as a main component thereof.

The present invention also provides a method for fabricating a ferroelectric memory device including the steps of: forming a cell transistor on a semiconductor substrate in each cell area: forming a ferroelectric capacitor overlying the cell transistor in the each cell area, the ferroelectric capacitor including a bottom electrode, ferroelectric film and a top electrode: forming an interconnect layer in contact with the top electrode: forming an interlayer dielectric film on the interconnect layer: forming a protective layer overlying the interlayer dielectric film, the protective layer having a higher modulus of elasticity than the interconnect layer: and forming an insulator film overlying the protective layer, the insulator film including at least one of $SiN_x$ or $SiO_xN_y$.

In accordance with the ferroelectric memory device of the present invention or manufactured by the method of the present invention, the protective layer suppresses reduction of the remnant polarization of the ferroelectric film during formation of the insulator film including $SiN_x$ or $SiNO_xN_y$ to improve the storage characteristic and the programming characteristic of the ferroelectric capacitor, due to the higher modulus of elasticity of the protective layer, which prevents transferring of the stress during formation of the insulator layer.

The above and other objects, features and advantages of the present invention will be more apparent from the following description, referring to the accompanying drawings.

PREFERRED EMBODIMENTS OF THE INVENTION

Figure 1:
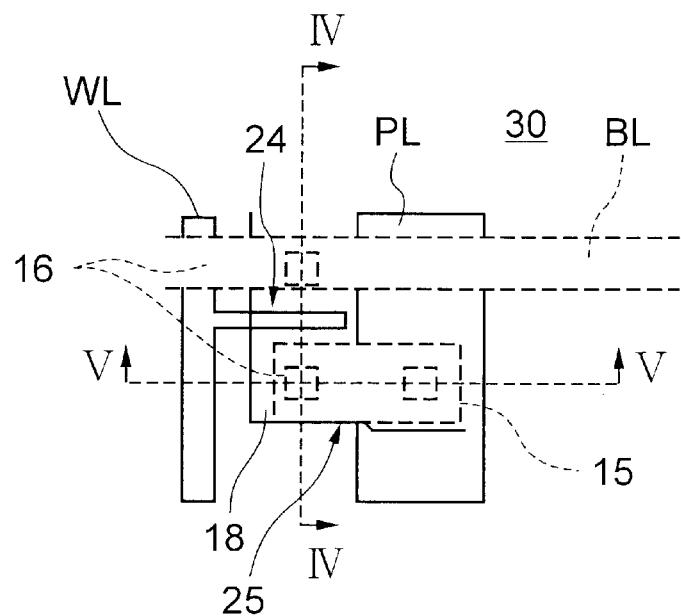
FIG. 1 is a top plan view of a memory cell having a ferroelectric capacitor in a conventional ferroelectric memory device.
Figure 2:
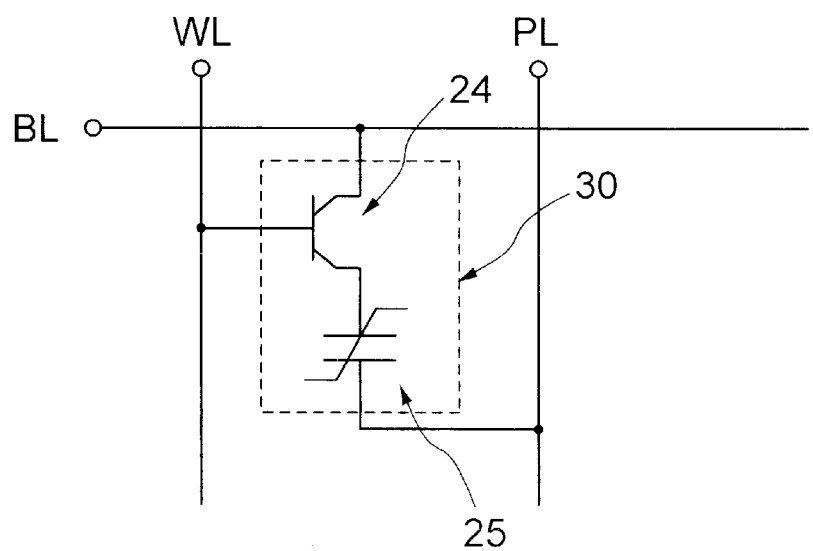
FIG. 2 is an equivalent circuit diagram of the memory cell of FIG. 1.

In the present invention, the protective layer as used for protecting the ferroelectric capacitor may be preferably a film including Ir or $IrO_2$ as a main component thereof, an Ir film formed on an $IrO_2$ film, a film including Ru or $RuO_2$ as a main component thereof, a Ru film formed on a $RuO_2$ film, or a film including $Al_2O_3$ as a main component thereof.

The reduction of the remnant polarization as encountered in the conventional device can be suppressed by cutting off transferring of the stress generated by a $SiN_x$ film or $SiO_xN_y$ film toward the ferroelectric film. This is primarily achieved by interposing a material having a high modulus of elasticity between the $SiN_x$ film or $SiO_xN_y$ film and the interconnect layer. The material having a high modulus of elasticity may be referred to as a material having a high hardness.

Element indium (Ir) is of a high hardness and has a young's modulus of about $5.3 \times 10^{11}$ N/cm² which is significantly higher compared to, for example, Al having a young's modulus of about $7.05 \times 10^{10}$ N/cm².

Iridium oxide ($IrO_2$), ruthenium (Ru), ruthenium oxide ($RuO_2$) and alumina ($Al_2O_3$) are hard materials comparable to indium (Ir). These hard materials have a function for suppressing the thermal stress transferred from the $SiN_x$ layer through the interconnect layer to the ferroelectric film.

Therefore, a protective layer including as a main component thereof at least one of Ir, $IrO_2$, Ru, $RuO_2$ and $Al_2O_3$ suppresses the reduction of the remnant polarization if interposed between the interconnect layer connected to the top electrode and the $SiN_x$ layer. The protective layer may be preferably deposited by a sputtering technique at a low temperature equal to or below 200° C.

Now, the present invention is more specifically described with reference to accompanying drawings, wherein similar constituent elements are designated by similar reference numerals throughout the drawings.

First Embodiment

A ferroelectric memory device according to a first embodiment of the present invention includes a memory cell array including a plurality of memory cells arranged in a matrix, a peripheral circuit disposed adjacent to the memory cell array, and an interconnection structure for connecting the memory cells and the peripheral circuit for storing or reading data in/from the memory cells.

Figure 4:
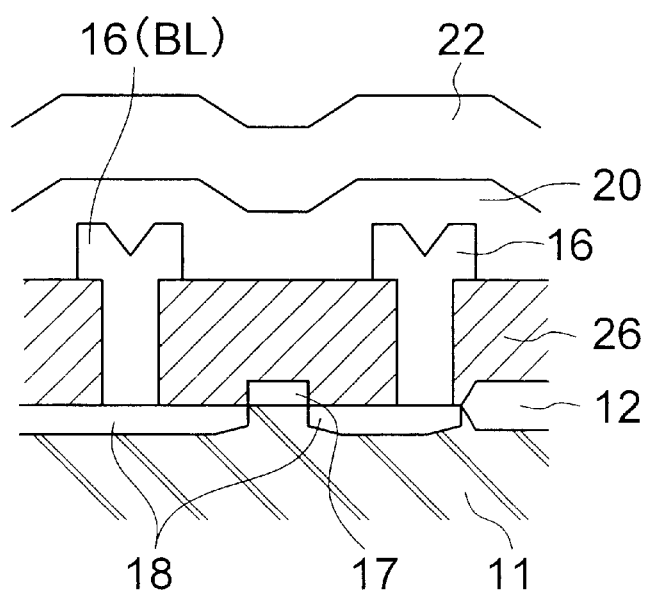
FIG. 4 is a sectional view of the memory cell of FIG. 1 taken along line IV—IV in FIG. 1.
Figure 5:
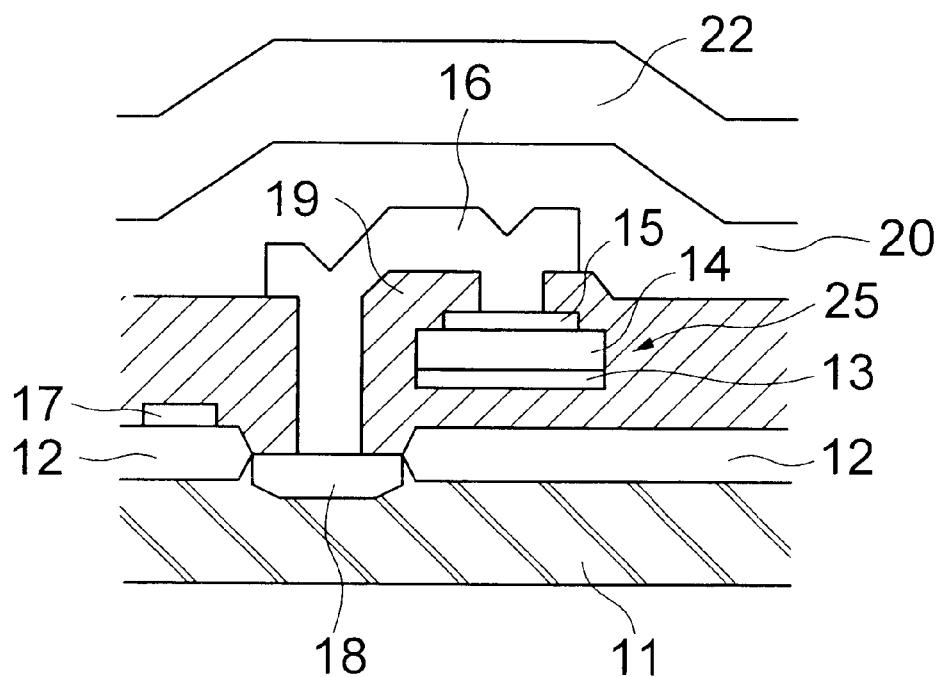
FIG. 5 is a sectional view of the memory cell of FIG. 1 taken along line V—V in FIG. 1.
Figure 6A:
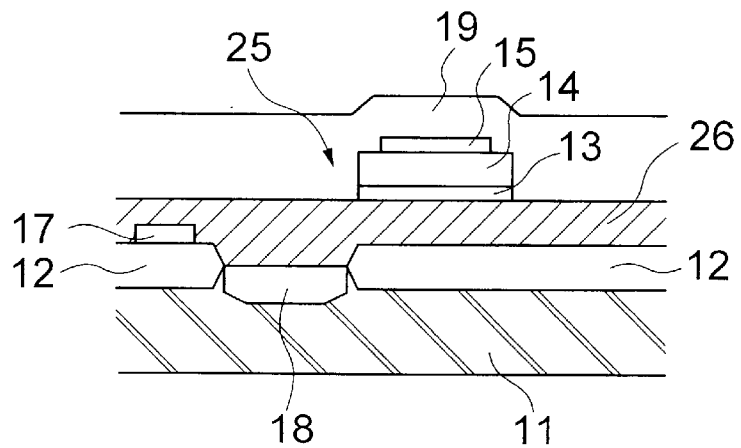
FIGS. 6A to 6C are sectional views of the memory cell taken along line IV—IV in FIG. 1, showing consecutive steps of fabrication of the memory cell.
Figure 6B:
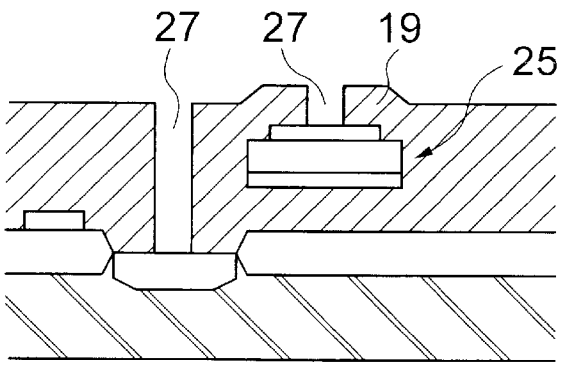
Figure 6C:
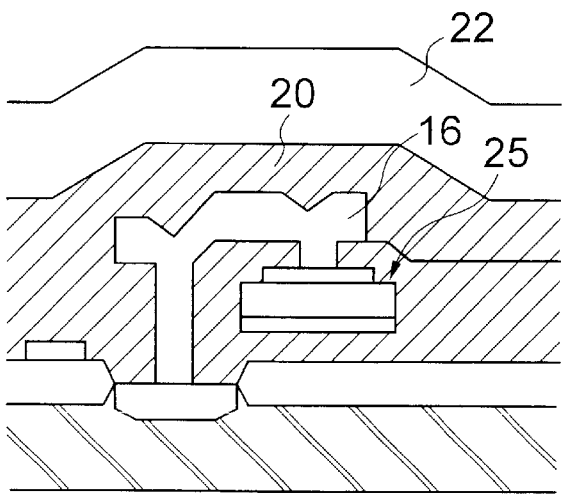
Figure 7:
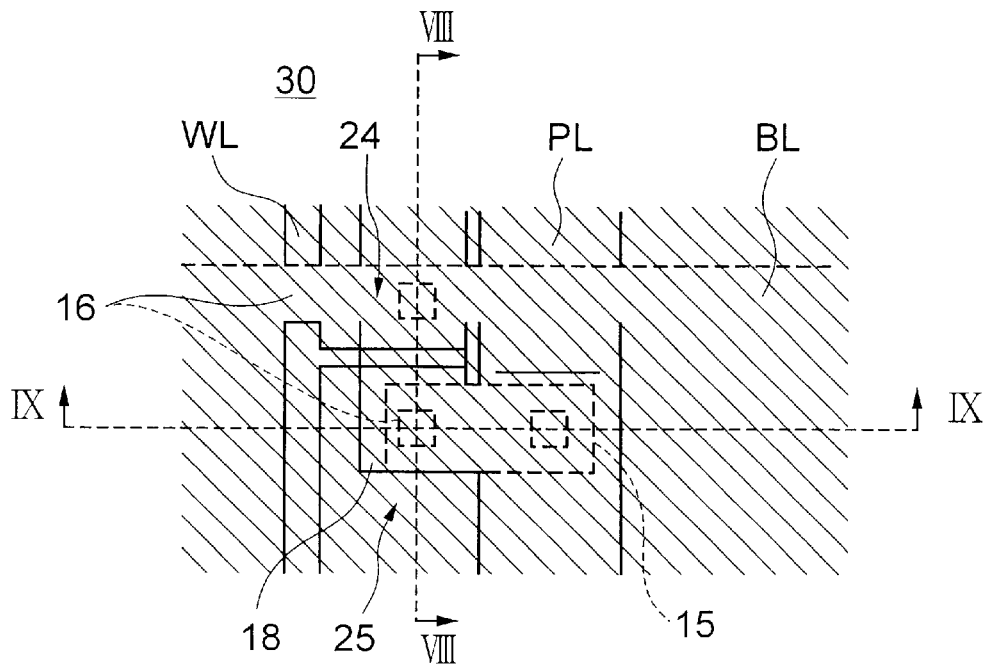
FIG. 7 is a top plan view of a memory cell having a ferroelectric capacitor in a ferroelectric memory device according to a first embodiment of the present invention.
Figure 8:
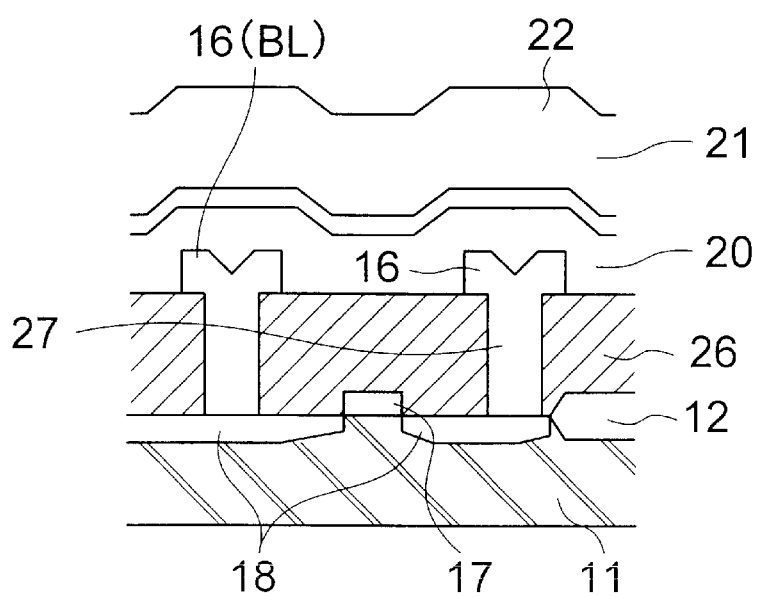
FIG. 8 is a sectional view of the memory cell of FIG. 7 taken along line VIII—VIII in FIG. 7.
Figure 9:
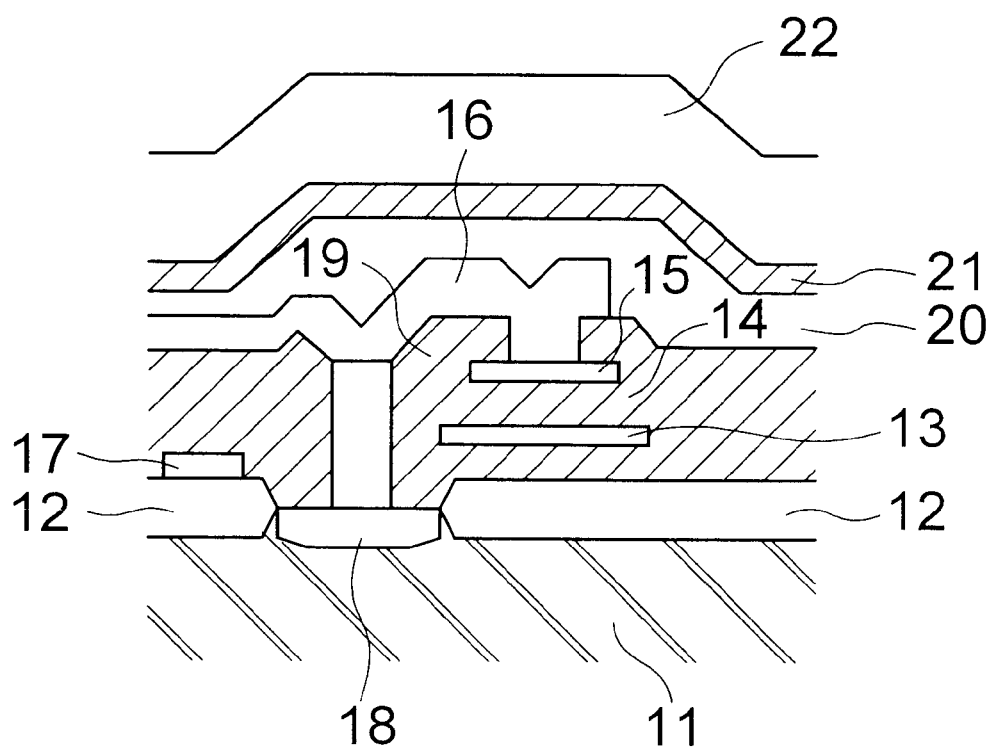
FIG. 9 is a sectional view of the memory cell of FIG. 7 taken along line IX—IX in FIG. 7.

Referring to FIGS. 7, 8 and 9, the memory cell in the ferroelectric memory device according to the present embodiment is similar to the conventional memory cell shown in FIGS. 1, 4 and 5 except for a first protective layer 21 and a second protective layer (insulator layer) 22 consecutively and separately formed on the ferroelectric capacitor.

More specifically, the memory cell includes a cell transistor 24 implemented by a FET, a ferroelectric capacitor 25 disposed above the cell transistor 24 and a cover film 19 covering the ferroelectric capacitor 25. The ferroelectric capacitor 25 includes a bottom electrode 13, a top electrode 15 disposed above the bottom electrode 13, and a ferroelectric film 14 interposed between the bottom electrode 13 and the top electrode 15. A via hole is provided for penetrating the cover film 19 to the top electrode 15 and receiving therein an interconnect layer 16 connecting the cell transistor 24 and the ferroelectric capacitor 25.

An interlayer dielectric film 20 is formed on the interconnect layer 16. On the interlayer dielectric film 20 is formed the first protective layer 21, on which the second protective layer 22 is formed. Noble metals such as Pt, Ir and Ru or conductive oxides such as $IrO_2$ and $RuO_2$ may be preferably used for the material of the bottom electrode 13. PZT [$(Pb,La)(Zr,Ti)O_3$] or SBT [$SrBi_2(NB,Ta)_2O_9$] may be used for the material of the ferroelectric film because these materials have a large remnant polarization to provide the memory cell having the ferroelectric capacitor with a sufficient storage function.

It is preferable that an Ir or Pt film be formed on an $IrO_2$ film to implement the top electrode 15. In this case, the $IrO_2$ film of the top electrode 15 disposed in contact with the ferroelectric film 14 alleviates the defect caused by a large number of times for overwriting of the ferroelectric film 14, to thereby improve the programming characteristic of the ferroelectric film, whereas the Ir or Pt film of the top electrode 15 reduces the contact resistance between the interconnect layer 16 and the top electrode 15.

$WSi_x$ may be preferably used for the material of the interconnect layer 16. Alternatively, if the interconnect layer 16 is to include Al having a lower resistivity, a layered structure including $WSi_x$ film, TiN film, Al film and TiN film as viewed from the bottom may be preferably used, wherein the TiN film is used as a barrier layer underlying the Al film.

The bit line in the present embodiment is implemented by the interconnect layer 16, as shown in FIGS. 7 and 8. Silicon oxide is used for the interlayer dielectric film 20. The first protective layer 21 may include at least one of Ir, $IrO_2$, Ru, $RuO_2$ and $Al_2O_3$. The second protective layer 22 includes $SiN_x$ or $SiO_xN_y$. An $Al_2O_3$ film may be interposed between the cover film 19 and the ferroelectric capacitor for protecting the ferroelectric film against evaporation of the elements in the ferroelectric film due to heat during fabrication of the memory device, or against the hydrogen generated in the cover film 19.

The first protective layer 21 suppresses the stress transferring to the ferroelectric film 14 from the second protective layer 22 including $SiN_x$ or $SiO_xN_y$ through the interconnect layer 16. The first protective layer 21 is preferably interposed between the interconnect layer 16 disposed in contact with the top electrode 15 and the second protective layer 22. If the first protective layer 21 including $Al_2O_3$ is interposed between the cover film 19 and the ferroelectric capacitor 25 while being in direct contact with the ferroelectric capacitor, the advantage of the present invention cannot be obtained.

In fabrication of an LSI having a multi-level interconnection structure including two or more interconnect layers, it is relatively easy in the prior art to cover the ferroelectric capacitor with an interconnect layer including Al, $WSi_x$, Ti and TiN as a main component thereof. In the present invention, however, it is confirmed by an experiment that if the protective layer includes Al, $WSi_x$, Ti and TiN as a main component thereof similarly to the interconnect layer of the conventional LSI having the multi-level interconnection structure, the polarization characteristic of the ferroelectric film is rather degraded. It is to be noticed in this respect that the first protective layer 21 in the present invention has a higher hardness than the interconnect layer 16 for effectively protecting the ferroelectric film 14.

In view of the above, the first protective layer 21 as used in the present invention should include at least one of Ir, $IrO_2$, Ru, $RuO_2$ and $Al_2O_3$, and should be interposed between the interconnect layer 16 disposed in contact with the top electrode and the second protective layer 22 which protects the ferroelectric capacitor against water or moisture.

Figure 10A:
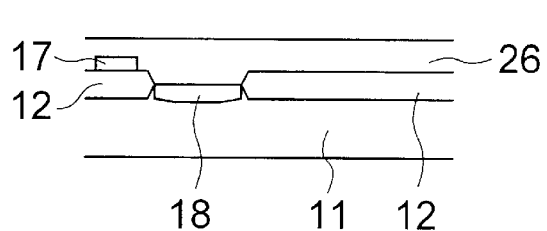
FIGS. 10A to 10G are sectional view of the memory cell of FIG. 7 taken along line IX—IX in FIG. 7, showing consecutive steps of fabrication thereof.

Referring to FIGS. 10A to 10G, there is shown a fabrication process for fabricating the ferroelectric memory device according to the present embodiment. In FIG. 10A, a MOSFET having source/drain regions 18 and a gate electrode 17 is formed on a semiconductor substrate 11, followed by formation of an interlayer dielectric film (silicon oxide film) 26 thereon.

Subsequently, a bottom electrode 13 of the ferroelectric capacitor is formed on the silicon oxide film 26 by sputtering, followed by formation of a ferroelectric film 14 on the bottom electrode 13. The ferroelectric film 14 is made from PZT or SBT by a sputtering technique, sol-gel technique or CVD technique.

Figure 10B:
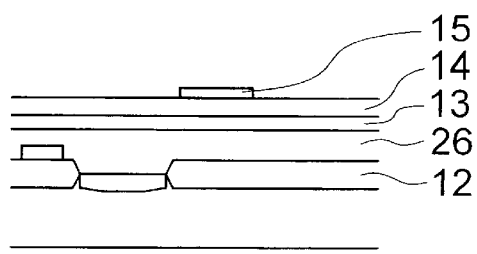
Figure 10C:
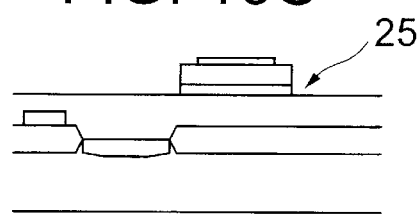
Figure 10D:
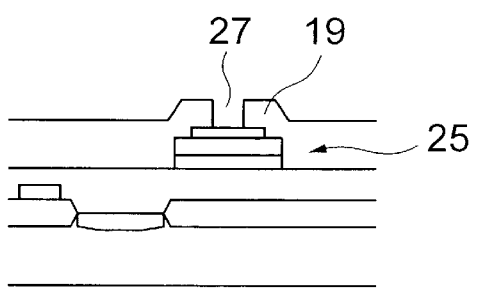
Figure 10E:
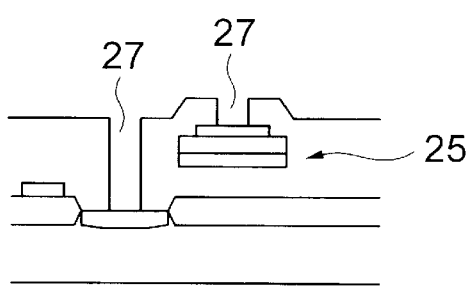

After forming a top electrode 15 of the ferroelectric capacitor by sputtering and subsequent patterning as shown in FIG. 10B, the ferroelectric film 14 and the bottom electrode 13 are also subjected to patterning, as shown in FIG. 10C. Then, a cover film 19 made of silicon oxide is deposited on the ferroelectric capacitor by a CVD technique and subjected to patterning to form via holes 27 therein for exposing portions of the top electrode 15 and the bottom electrode 13, as shown in FIG. 10D. Thereafter, other via holes 27 are formed in the cover film 19 and the interlayer dielectric film 26 for exposing the diffused regions 18, as shown in FIG. 10E.

Figure 10F:
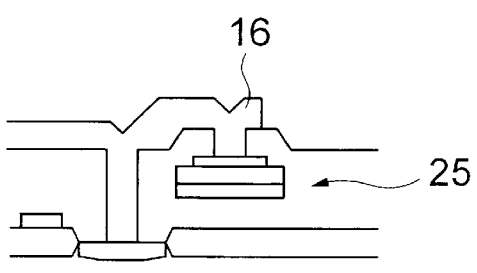

Subsequently, an interconnect layer 16 is formed by sputtering or CVD of $WSi_x$ and subsequent patterning thereof, as shown in FIG. 10F. In an alternative, another film including Al or TiN as a main component thereof may be additionally deposited by sputtering or CVD on the sputtered $WSi_x$ film, followed by patterning of the another film together with the sputtered $WSi_x$ film.

An interlayer dielectric film 20 made of silicon oxide is then deposited on the entire surface, followed by deposition of the first protective layer 21 by a sputtering technique and subsequent deposition of the second protective layer 22 by a CVD technique. The first protective layer 21 is preferably formed at a low temperature equal to or below 200° C. so that the first protective layer 21 itself does not apply a thermal stress to the ferroelectric film 14 to degrade the polarization characteristic thereof.

Second Embodiment

Figure 11:
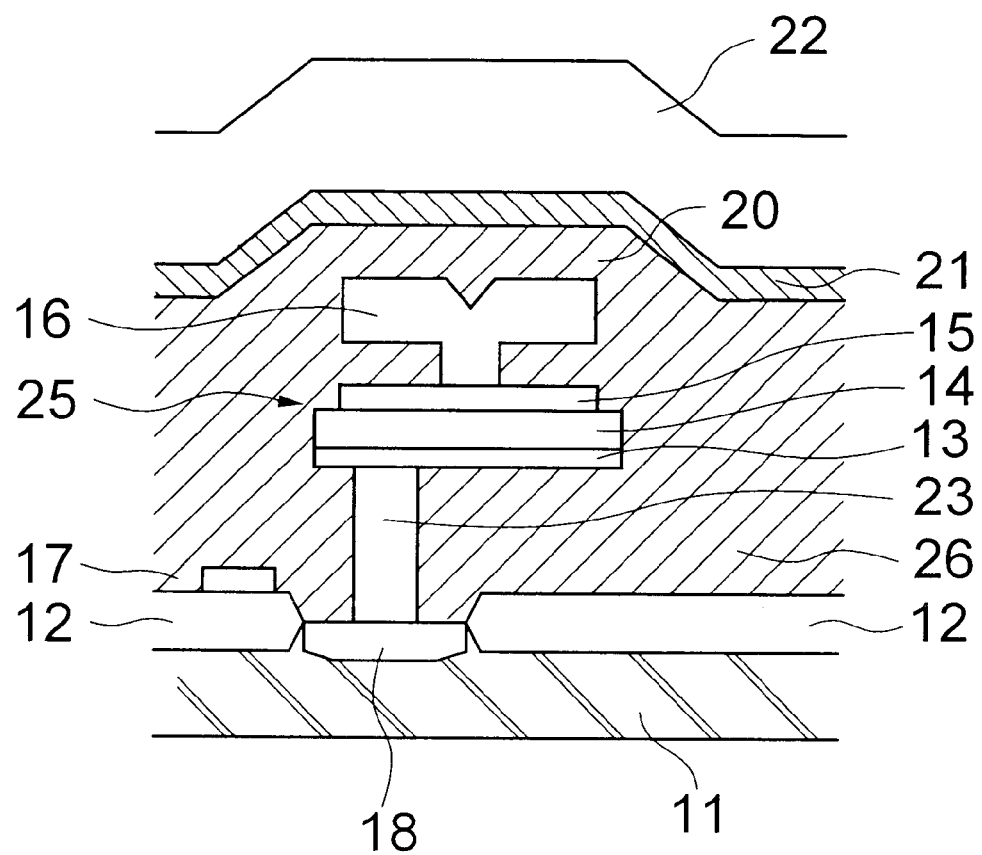
FIG. 11 is a sectional view of a memory cell having a ferroelectric capacitor in a ferroelectric memory device according to a second embodiment of the present invention.

Referring to FIG. 11, a ferroelectric memory device according to a second embodiment of the present invention is similar to the first embodiment except that the bottom electrode 13 is connected to one of the source/drain regions 18 through a silicon via plug 23, and the top electrode 15 is connected to the interconnect layer 16 acting as a plate line. On the interconnect layer 16 is deposited the interlayer dielectric film 20, on which the first protective layer 21 and the second protective layer 22 are consecutively formed.

$WSi_x$ is preferably used for the interconnect layer 16. If Al is to be used, on the other hand, for a lower resistivity of the interconnect layer 16, the interconnect layer preferably includes $WSi_x$ film, TiN film, Al film and TiN film as viewed from the bottom, wherein the TiN film is used for the barrier layer between the Al film and the Si film and the $WSi_x$ film is used for the underlying layer.

The top electrode 15 may be preferably implemented by a layered structure including an Ir or Pt film formed on an $IrO_2$ film for stabilizing the interface between the top electrode 15 and the interconnect layer 16 and obtaining excellent characteristics of the ferroelectric capacitor 25.

Silicon oxide may be used for the interlayer dielectric film 20. The first protective layer 21 may include at least one of Ir, $IrO_2$, Ru, $RuO_2$ and $Al_2O_3$ as a main component thereof. $SiN_x$ film or $SiO_xN_y$ film is used for the second protective layer 22 in the present embodiment.

Third Embodiment

Figure 12:
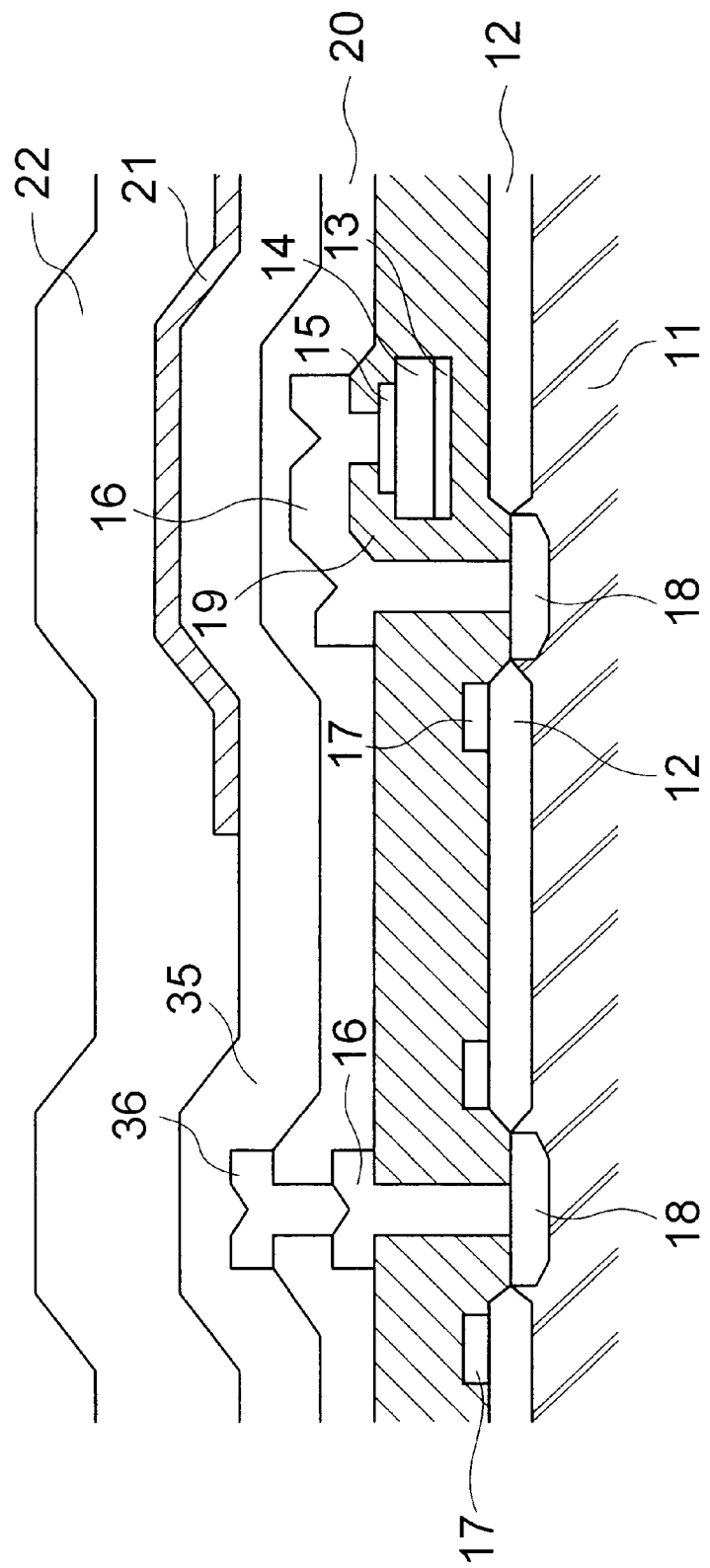
FIG. 12 is a sectional view of a memory cell having a ferroelectric capacitor in a ferroelectric memory device according to a third embodiment of the present. invention

Referring to FIG. 12, a ferroelectric memory device according to a third embodiment of the present invention is similar to the first embodiment except that the first protective layer 21 is formed only in the area for the cell array on another interlayer dielectric film 35, which is formed on the interlayer dielectric film 20 covering the interconnect layer 16. In the present embodiment, a second interconnect layer 36 including Al as a main component thereof is formed on the interlayer dielectric film 20 for implementing the peripheral circuit of the memory device. The first protective layer 21 may be formed at any level so long as the first protective layer 21 is disposed between the interconnect layer 16 overlying the top electrode 15 and the second protective layer 22.

Figure 13:
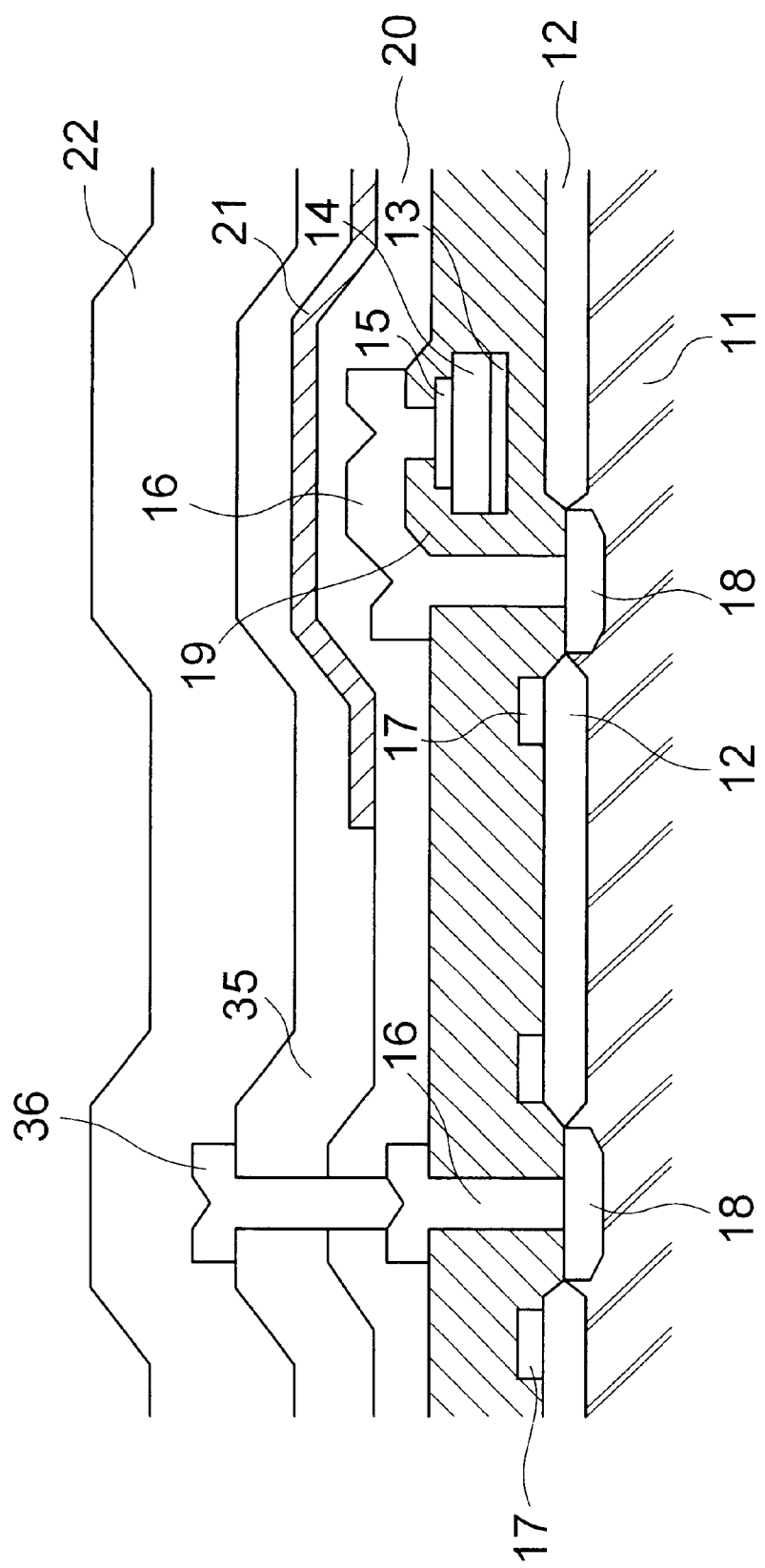
FIG. 13 is a sectional view of a memory cell modified from FIG. 12.

It is sufficient that the first protective layer 21 in the present invention is disposed only just above the memory cell array because the first protective layer 21 is designed only for protection of the ferroelectric capacitor 25. Thus, if the first protective layer 21 is made from a conductive material such as including Ir, $IrO_2$, Ru and $RuO_2$ as a main component, the protective layer 21 should be preferably etched in the area other than the cell array area by a RIE technique, for example, as shown in FIGS. 12 and 13. This may prevent a short-circuit failure occurring between the pads used for lead terminals in the peripheral circuit.

Figure 14:
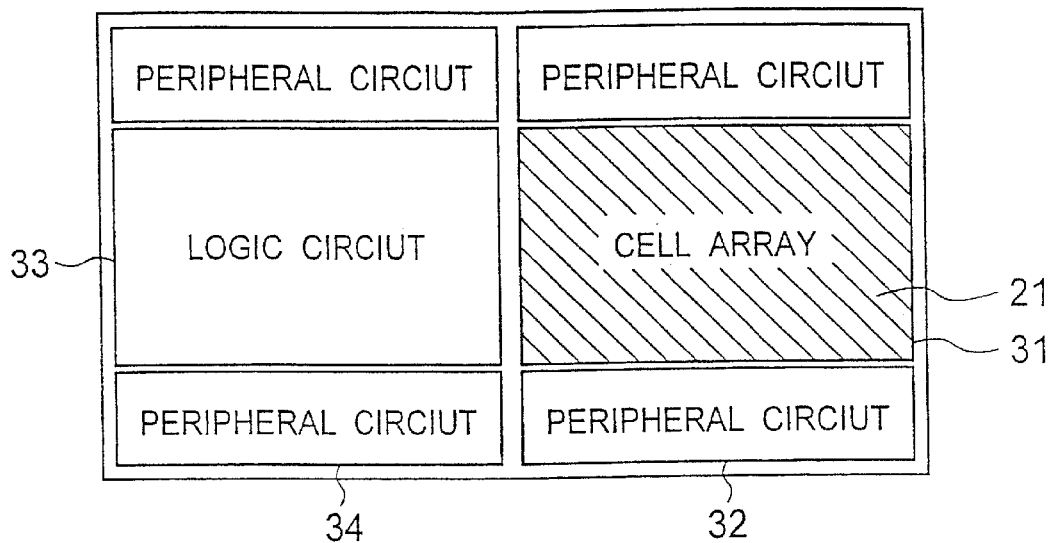
FIG. 14 is a top plan view of an LSI including a ferroelectric memory device according to an embodiment of the present invention and a logic circuit.

Some hybrid circuits include a ferroelectric memory device and a logic circuit on a single chip having a two- or more-layer interconnection structure. In such a hybrid circuit, as shown in FIG. 14, the first protective layer 21 is removed from the areas for the logic circuit 33, peripheral circuit 34 for the logic circuit 33, and the peripheral circuit 32 of the memory device selectively from the area for the cell array 31 of the memory device.

FIRST EXAMPLE

First example of the first embodiment of FIGS. 7, 8 and 9 was manufactured. The ferroelectric capacitor 25 underlying the interlayer dielectric film 20 had a bottom electrode 13 including consecutively a Ti film and a Pt film as viewed from the bottom thereof, a ferroelectric film 14 made of $Pb_{1.15}Zr_{0.4}Tr_{0.6}O_3$ and a top electrode 15 including consecutively an $IrO_2$ film and an Ir film as viewed from is the bottom.

The Ir film on the $IrO_2$ film functions for prevention of increase in the contact resistance between the top electrode 15 and the interconnect layer 16 due to oxidation of the interconnect layer 16 by the $IrO_2$ layer. The cover film 19 overlying the ferroelectric capacitor 25 was implemented by a silicon oxide film.

The via plugs connecting the cell transistor, the ferroelectric capacitor and the bit line included one for receiving the interconnect layer 16 connecting one of the source/drain regions 18 and the top electrode 15 of the ferroelectric capacitor 25, and another for receiving the interconnect layer 16 connecting the other of the source/drain regions 18 and the bit line.

The interconnect layer 16 was implemented by a layered structure including $WSi_{2.4}$ film, TiN film, Al film and TiN film as viewed from the bottom, the TiN film acting as a barrier layer for prevention of diffusion between Al and Si. $WSi_{2.4}$ has an excellent adherence with respect to $SiO_2$ and has a lower contact resistance with respect to Si. $WSi_{2.4}$ also functions for suppressing degradation of the polarization characteristic of the ferroelectric capacitor after formation of the interconnect layer 16, as described in JP-A-10-095846. The top TiN layer functions as a anti-reflection layer.

The interlayer dielectric film 20 formed on the interconnect layer 16 was implemented by a silicon oxide film, the first protective layer 21 formed on the interlayer dielectric film 20 included $IrO_2$ film and Ir film, and the second protective layer 22 formed on the first protective layer 21 was implemented by a SiON film.

The above example was manufactured as follows. In FIG. 10A, a cell transistor including a gate oxide film and source/drain regions 18 is first formed on a p-type silicon substrate 11 by a known technique, followed by a low-pressure CVD process of $SiO_2$ and a subsequent CMP (chemical-mechanical polishing) process for planarization of the top surface of the wafer.

A 20-nm-thick Ti film having excellent adherence with respect to the underlying $SiO_2$ film and a 200-nm-thick Pt film were then formed as the bottom electrode 13 by using a DC sputtering technique. A 300-nm-thick PZT $[Pb_{1.15}Zr_{0.4}Tr_{0.63}O_3]$ film was then formed by using a sol-gel technique. The starting material for the PZT film was a mixed solution of $Pb(CH_3COO)_2$, $Zr(OC_2H_5)_4$ and $Ti(i-OC_3H_7)$ having a Pb concentration of 0.6 mole/liter. The mixed solution was spin-coated onto the Pt film, dried at 250° C. for 9 minutes in a nitrogen ambient, and baked at 600° C. for 10 minutes in an oxygen ambient. By iterating the spin-coating, drying and baking for three times each, a 300-nm-thick PZT film was formed.

Thereafter, a 50-nm-thick $IrO_2$ film and a 100-nm-thick Ir film were consecutively deposited thereon, followed by patterning thereof using a photoresist mask to form the top electrode 15, as shown in FIG. 10B. The PZT/Pt/Ti films are then patterned to form the bottom electrode 13 by using the photoresist mask, as shown in FIG. 10C.

A 400-nm-thick cover film 19 was then deposited by an $O_3$-TEOSCVD of $SiO_2$ to cover the overall area of the wafer, followed by selective etching thereof by using a RIE (reactive-ion etching) technique using $CF_4$ as an etching gas and a photoresist mask to form via holes for exposing the top electrode 15 and the bottom electrode 13, as shown in FIG. 10D. Thereafter, a thermal annealing was conducted at 600° C. for 10 minutes to remove damages of the ferroelectric capacitor caused by the RIE.

Then, via holes exposing the diffused regions 18 were formed by a RIE technique using $CHF_3$ as an etching gas, as shown in FIG. 10E. A 50-nm-thick $WSi_{2.4}$ film was then deposited by a DC sputtering technique to form a bottom film of the interconnect layer 16. The Ir film of the top electrode was scarcely oxidized at 600° C. in an oxygen ambient except for the surface thereof, which was slightly oxidized.

Since the oxide indium film remains as a conductor, the oxidation itself of the Ir film is not necessarily a cause of malfunction for electric conduction. However, the oxide surface of the Ir film of the top electrode 15 caused by the thermal annealing may cause oxidation of $WSi_{2.4}$ during a subsequent thermal treatment to increase the resistance of the interface between the Ir film and the $WSi_{2.4}$ film. For preventing this problem, the present embodiment preferably includes dry etching of the surface of the Ir film by using a reactive gas such as $CHF_3$ before deposition of the $WSi_{2.4}$ film. On the deposited $WSi_{2.4}$ film, a 100-nm-thick TiN film was then deposited by reactive sputtering using a mixture of Ar and N2.

A 550-nm-thick Al film and a 30-nm-thick anti-reflection TiN film were then consecutively deposited and patterned by a RIE technique using $Cl_2$ gas as an etching gas to form the top films of the interconnect layer 16, as shown in FIG. 10F. Subsequently, a 400-nm-thick $SiO_2$ film was deposited on the interconnect layer 16 by an $O_3$-TEOSCVD technique to form the interlayer dielectric film 20, followed by deposition using a DC sputtering technique to form a 50-nm-thick $IrO_2$ film and a 100-nm-thick Ir film implementing the first protective layer 21 in combination. The DC sputtering is conducted without heating the substrate.

Figure 10G:
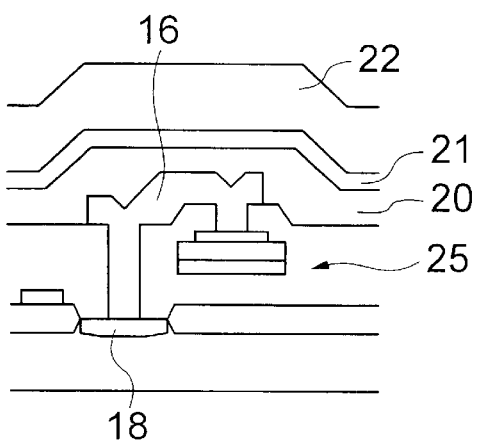

The first protective layer 21 was removed in the area other than the cell array area by a RIE technique. Then, a 1-$\mu$m-thick SiON film was deposited as the second protective layer 22, as shown in FIG. 10G at a substrate temperature of 300° C. by a PECVD technique using material gases including $SiH_3$, $NH_3$ and $N_2O$ and parallel plate electrodes.

The ferroelectric memory device as obtained by the above process was examined for measuring the switching charge for the resultant PZT (ferroelectric) capacitor. To compare the ferroelectric memory device of the present example against a conventional ferroelectric memory device, another ferroelectric memory device was also manufactured which included no first protective layer 21 with the remaining structure being similar to that of the present example.

Figure 3:
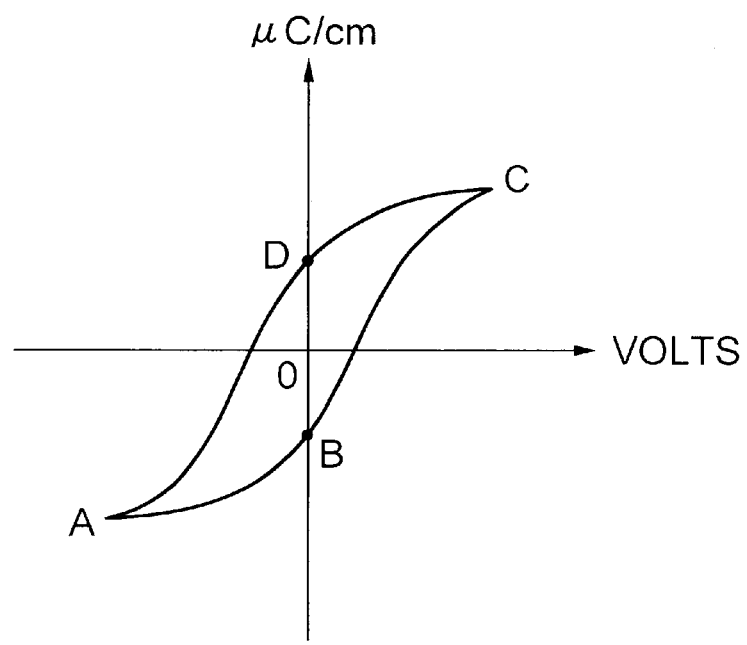
FIG. 3 is a graph of polarization characteristic of the ferroelectric film of the ferroelectric capacitor in FIG. 1.
Figure 15:
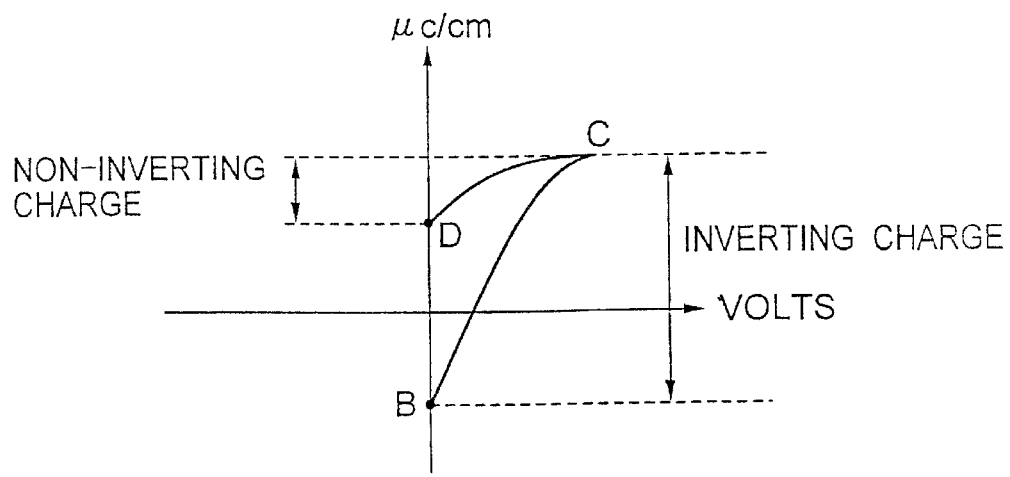
FIG. 15 is a graph for switching charge of the ferroelectric film.

The term "switching charge" as used herein means inverting charge and non-inverting charge of the ferroelectric capacitor. The graph for the switching charge is shown in FIG. 15 which is a part of the hysteresis polarization curve of FIG. 3 for the ferroelectric capacitor. The remnant polarization is defined by a difference between the inverting charge and the non-inverting charge, and a larger remnant polarization is preferable because the larger remnant polarization provides the ferroelectric memory device with an excellent storage characteristic.

Figure 16:
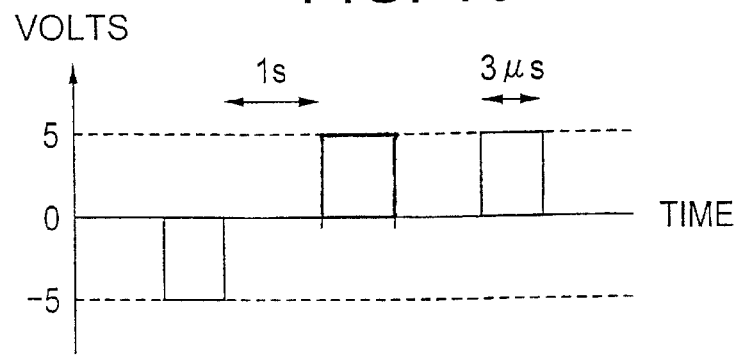
FIG. 16 is a timing chart of the pulse train used for measurement of switching charge as shown in FIG. 15.

The switching charge was measured by applying a pulse train such as shown in FIG. 16 between the top electrode and the bottom electrode. The first pulse having a negative polarity renders the polarization of the ferroelectric capacitor to shift from point C to point B on the polarization curve, then the inverting charge is measured while the second pulse having a 5 volt is applied to render the polarization of the ferroelectric film to shift from point B to point D. Further, the non-inverting charge is measured while the third pulse is applied to render the polarization to shift from point D to point C. The pulse train had a pulse width of 3 microseconds and an interval of 1 second between adjacent pulses, as shown in FIG. 16.

The PZT capacitor included a top electrode having a size of a 3 $\mu$m×3 $\mu$m square. To reduce noise during the measurement, a plurality (1122) of PZT capacitors having an equal capacitance are connected in parallel.

Figure 17:
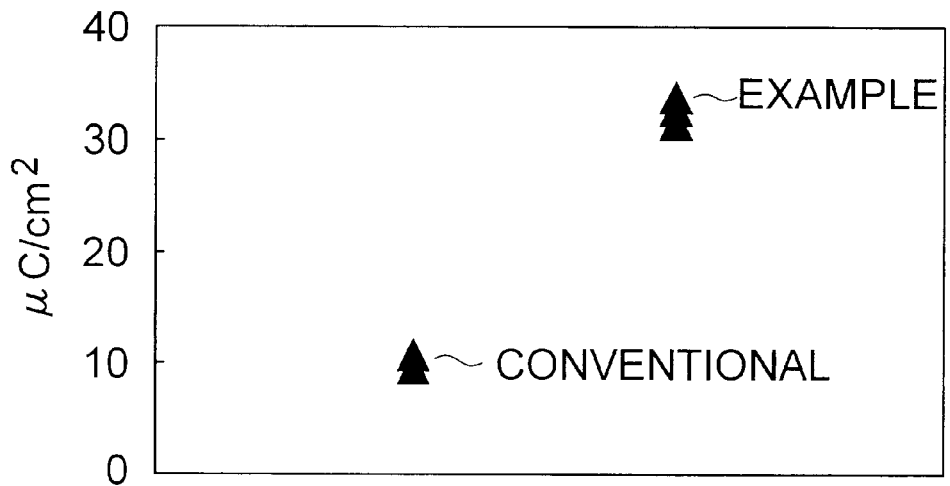
FIG. 17 is a graph of remnant polarizations of ferroelectric capacitors having a protective layer of the present invention and no such protective layer.

The results of the measurements are shown in FIG. 17. The remnant polarization is calculated as the difference between the inverting charge and the non-inverting charge measured during the switching charge. Each sample was subjected to the measurements at five points in the wafer. The ferroelectric capacitor of the present example exhibited an excellent remnant polarization as high as about 30 $\mu$C/cm$^2$, whereas the conventional ferroelectric capacitor exhibited a poor remnant polarization of 10 to 11 $\mu$C/cm$^2$.

The second protective layer 22 deposited for prevention of water, if it is deposited at a low temperature by a RF sputtering technique, was expected to cause substantially no degradation of the ferroelectric capacitor. In the present invention, however, the second protective layer 22 is preferably deposited by a PECVD technique to obtain a fine film property for effectively preventing the water in the ambient from entering to the interconnect layer 16. In other words, a known PECVD process is sufficient for deposition of the second protective layer 22 on the first protective layer 21 in the present embodiment.

SECOND EXAMPLE

Second example of the first embodiment had a 100-nm-thick first protective layer 21 made of Al$_2$O$_3$. The Al$_2$O$_3$ film was deposited by a RF sputtering with the substrate being maintained at a room temperature. A ferroelectric capacitor 25 having a size of a 3 $\mu$m×3 $\mu$m square was manufactured similarly to the first example except for the ferroelectric film 14, and subjected to the measurements of the switching charge.

Figure 18:
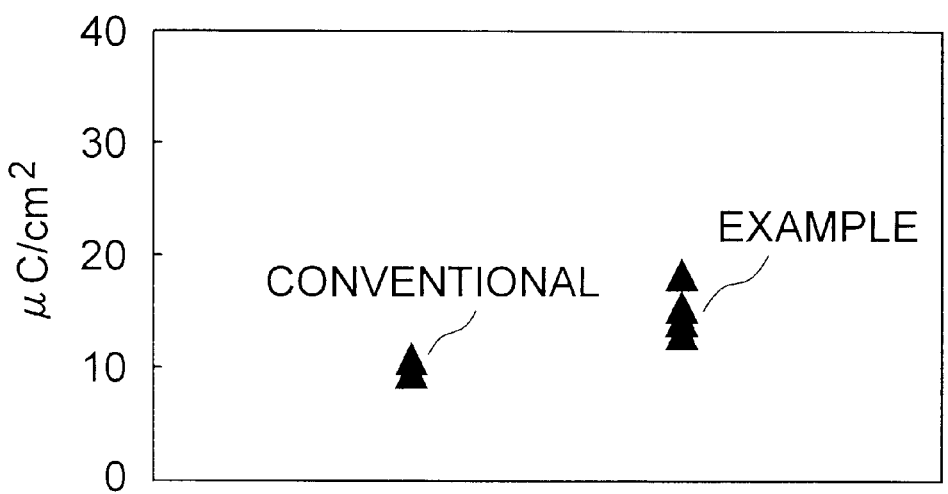
FIG. 18 is a graph of remnant polarizations of ferroelectric capacitors having another protective layer made of $Al_2O_3$ and no such protective layer.

The results of the measurements are shown in FIG. 18 for five points of the wafer. The first protective layer 21 made of Al$_2$O$_3$ provided the ferroelectric capacitor 25 with a remnant polarization of 15 $\mu$C/cm$^2$ after formation of the second protective layer 22, which is significantly improved from the conventional ferroelectric capacitor having no first protective layer.

Since the above embodiments are described only for examples, the present invention is not limited to the above embodiments and various modifications or alterations can be easily made therefrom by those skilled in the art without departing from the scope of the present invention.

What is claimed is:

1. A ferroelectric memory device comprising:
   a plurality of memory cells arranged in an array of memory cells each having a cell transistor and a ferroelectric capacitor formed on a semiconductor substrate;
   a peripheral circuit;
   an interconnection structure for connecting said cell transistor, said ferroelectric capacitor and said peripheral circuit to store data in each of said memory cells, said ferroelectric capacitor including a bottom electrode, a ferroelectric film and a top electrode, said interconnection structure including a first interconnect layer in contact with said top electrode;
   an interlayer dielectric film formed on said first interconnect layer;
   an insulator film overlying said interlayer dielectric film and including at least one of SiN$_x$ and SiO$_x$N$_y$; and
   a protective layer disposed between said interlayer dielectric film and said insulator film, said protective layer including at least one of Ir, IrO$_2$, Ru, RuO$_2$, and having a higher modulus of elasticity than said interconnect layer.

2. The ferroelectric memory device as defined in claim 1, wherein said protective layer includes consecutively an IrO$_2$ film and an Ir film as viewed from the bottom.

3. The ferroelectric memory device as defined in claim 1, wherein said protective layer includes consecutively a RuO$_2$ film and a Ru film as viewed from the bottom.

4. The ferroelectric memory device as defined in claim 1, said protective layer is removed in an area for said peripheral circuit.

5. The ferroelectric memory device as defined in claim 1, wherein the top electrode on the ferroelectric film includes an IrO$_2$ film in contact with the ferroelectric film and at least one of an Ir and Pt film on the IrO$_2$ film.

* * * * *